United States Patent [19]

Usami

[11] Patent Number: 4,886,987
[45] Date of Patent: Dec. 12, 1989

[54] PROGRAMMABLE LOGIC ARRAY WITH 2-BIT INPUT PARTITIONING

[75] Inventor: Kimiyoshi Usami, Kawasaki, Japan

[73] Assignee: Kabushiki Kaisha Toshiba, Kawasaki, Japan

[21] Appl. No.: 192,767

[22] Filed: May 11, 1988

[30] Foreign Application Priority Data

May 27, 1987 [JP] Japan ................................ 62-128365

[51] Int. Cl.$^4$ .......................................... H03K 19/177
[52] U.S. Cl. .................................... 307/465; 307/448; 307/449; 307/468
[58] Field of Search ............... 307/443, 448, 449, 463, 307/451–453, 465, 468, 469; 364/716

[56] References Cited

U.S. PATENT DOCUMENTS

| | | | |
|---|---|---|---|
| 4,177,452 | 12/1979 | Balasubramanian et al. | 307/468 X |
| 4,429,238 | 1/1984 | Harrison | 307/465 |
| 4,625,130 | 11/1986 | Murray | 307/448 X |
| 4,675,556 | 6/1987 | Bazes | 307/449 X |
| 4,725,742 | 2/1988 | Tachimori et al. | 307/449 |
| 4,739,195 | 4/1988 | Masaki | 307/448 X |

FOREIGN PATENT DOCUMENTS 54-48132 4/1979 Japan .
0022496 1/1986 Japan .................. 307/468

OTHER PUBLICATIONS

Moore et al., "Metal Oxide Transistor Decode Circuit", IBM T.D.B., vol. 9, No. 6, Nov. 1966, pp. 703–704.
Cases et al., "Improving the Performance of a Transfer Gate PLA Structure", IBM T.D.B., vol. 25, No. 4, Sep. 1986, pp. 2215–2216.
Fleisher et al., "An Introduction to Array Logic", IBM Journal of Research and Development, Mar. 1975, pp. 98–109.

*Primary Examiner*—David Hudspeth
*Attorney, Agent, or Firm*—Foley & Lardner, Schwartz, Jeffery, Schwaab, Mack, Blumenthal & Evans

[57] ABSTRACT

A programmable logic array comprises an input decoder having a plurality of paired first transistors inputting signals and connected in series to each other, the input decoder outputting predetermined logic signals through the first transistors based on the input signals and inverted input signals thereof; second transistors for supplying the logic output signals of the input decoder to corresponding input lines in an AND array region; and third transistors for predischarging the input lines of the AND array region.

7 Claims, 4 Drawing Sheets

PROGRAMMABLE LOGIC ARRAY WITH 2-BIT INPUT PARTITIONING

The present invention relates to a programmable logic array provided with an input decoder.

BACKGROUND OF THE INVENTION

A programmable logic array(which is called PLA in the following description) is disposed in various kinds of logic LSIs such as the one in a microprocessor and is used as a control circuit and a decoding circuit, and is provided with an input decoder for decoding an input signal to reduce the number of product term lines and reduce the size of the area of the logic array.

FIG. 1 is a view showing the construction of PLA provided with an input decoder. In FIG. 1, the PLA is constituted by two bit input decoders 1 each receiving two corresponding input signals from input signals $x_1$ to $x_N$ and providing four decoding outputs by taking a logic operation of the two corresponding input signals, an array region (which is called AND plane in the following description) 3 for producing logic product terms $S_1$ and $S_m$ with respect to decoding outputs $d_1$ to $d_m$ of the respective input decoders 1, and an array region 5 for receiving the respective logic product terms $S_1$ to $S_m$ produced on the AND plane and producing logic sum terms $O_1$ to $O_l$ with respect to the respective logic product terms $S_1$ to $S_m$, thereby outputting product and sum signals of the input signals $x_1$ to $x_N$.

FIG. 2 is a view showing an example of the detailed construction of one of the input decoders 1 of the PLA shown in FIG. 1. The one input decoder 1 of FIG. 2 is constituted by a decoder for receiving input signals $x_1$ and $x_2$ for example, and the other input decoders 1 are similarly constructed.

In FIG. 2, the input decoder 1 is constituted by a NOR gate 7a for inputting the input signals $x_1$ and $x_2$, a NOR gate 7b for inputting the input signal $x_1$ and an inverted signal of the input signal $x_2$ inverted through an inverter 9b, a NOR gate 7c for inputting an inverted signal of the input signal $x_1$ inverted through an inverter 9a and the input signal $x_2$, and a NOR gate 7d for inputting the respective inverted signals of the input signals $x_1$ and $x_2$ inverted through the inverters 9a and 9b.

In FIG. 2, the input decoder 1 is constituted by using a gate circuit so that it is very difficult to perform high integration of the input decoder 1, which becomes more serious with the increase of the number of input signals.

FIG. 3 is a view showing the construction of a PLA provided with an input decoder 11 for receiving input signals $x_1$ and $x_N$ and supplying decoding outputs $d_1$ and $d_{2N}$ to an AND plane 3 by performing a logic operation of the input signals. FIG. 4 is a view showing an example of the detailed construction of the input decoder 11 shown in FIG. 3. In FIG. 3, the same or corresponding portions as those of FIG. 1 are designated by the same reference numerals, and are thereby not described in detail in the following description.

In FIG. 4, the input decoder 11 has N input lines 13 for receiving corresponding input signals $x_1$ to $x_N$, N input lines 17 for receiving inverted input signals provided by inverting the corresponding input signals by inverters 15, and a plurality of output lines 21 connected to a power source $V_{DD}$ through FETs 19 of P-channel type having gate terminals connected to ground. The N input lines 13, the N input lines 17 and the plurality of output lines 21 are arranged in the shape of a matrix. As shown in FIG. 5, FETs 23 of N-channel type are disposed at predetermined intersections of the respective input lines 13, 17 and the output lines 21 to provide a logic similar to the one of the input decoder 1 shown in FIG. 2 from the output lines 21 with respect to the respective input signals.

The input decoder 11 of FIG. 4 is constituted by a matrix structure so that the integrated degree is high in comparison with the input decoder 1 using the gate circuit of FIG. 2.

However, when two bit decoding is performed with respect to N input signals where N is an even number, it is necessary to dispose 2N input lines 13 and 17, and 2N output lines 21 so that the area of the input decoder has 2N (the number of input lines) times 2N (the number of output lines)=$4N^2$ and is therefore increased in proportion to square of the number of input signals.

In FIG. 4, the regions enclosed by dotted lines are regions in which the FETs 23 are not formed, and the ratio of these enclosed regions to the entire area of the decoder is increased as the number of input signals is increased, thereby increasing such useless regions as the size of the input decoder 11 is increased.

Further, the inverters 15 for inverting the input signals have output terminals directly connected to the input lines 17 so that it is necessary to increase the sizes of the inverters 15 when the structure of the decoder is made large as the number of input signals is increased.

Accordingly, it is difficult to attain high integration even in the input decoder 11 having the matrix structure shown in FIG. 4.

As mentioned above, it is difficult to attain high integration of the PLA provided with the input decoder, even when the input decoder is constructed by using the logic gate circuit shown in FIG. 2, or even when the input decoder is constructed by using the matrix structure as shown in FIG. 4.

SUMMARY OF THE INVENTION

To overcome the problems mentioned above, an object of the present invention is to provide a programmable logic array provided with an input decoder and performing high integration.

With the above object in view, the present invention resides in a programmable logic array comprising an input decoder for controlling the operation of a plurality of paired transistors connected in series to each other by input signals or inverted input signals. The input decoder outputs different predetermined logic signals with respect to the input signals and the inverted input signals, respectively. The programmable logic array further comprises transistors for supplying the respective logic outputs of the input decoder to corresponding input lines in an AND array region, and transistors for predischarging the input lines of the AND array region.

In the construction mentioned above, the operation of the paired transistors constituting the input decoder and connected in series to each other is controlled by the input signals or the inverted input signals, and the predetermined logic outputs with respect to the input signals and the inverted input signals are supplied to the input lines of the AND array region through the transistors.

BRIEF DESCRIPTION OF THE DRAWINGS

The present invention will be more apparent from the following description of the preferred embodiments thereof in conjunction with the accompanying drawings in which.

DETAILED DESCRIPTION OF THE PREFERRED EMBODIMENTS

The preferred embodiments of the present invention will now be described with reference to the accompanying drawings.

Figure 6:
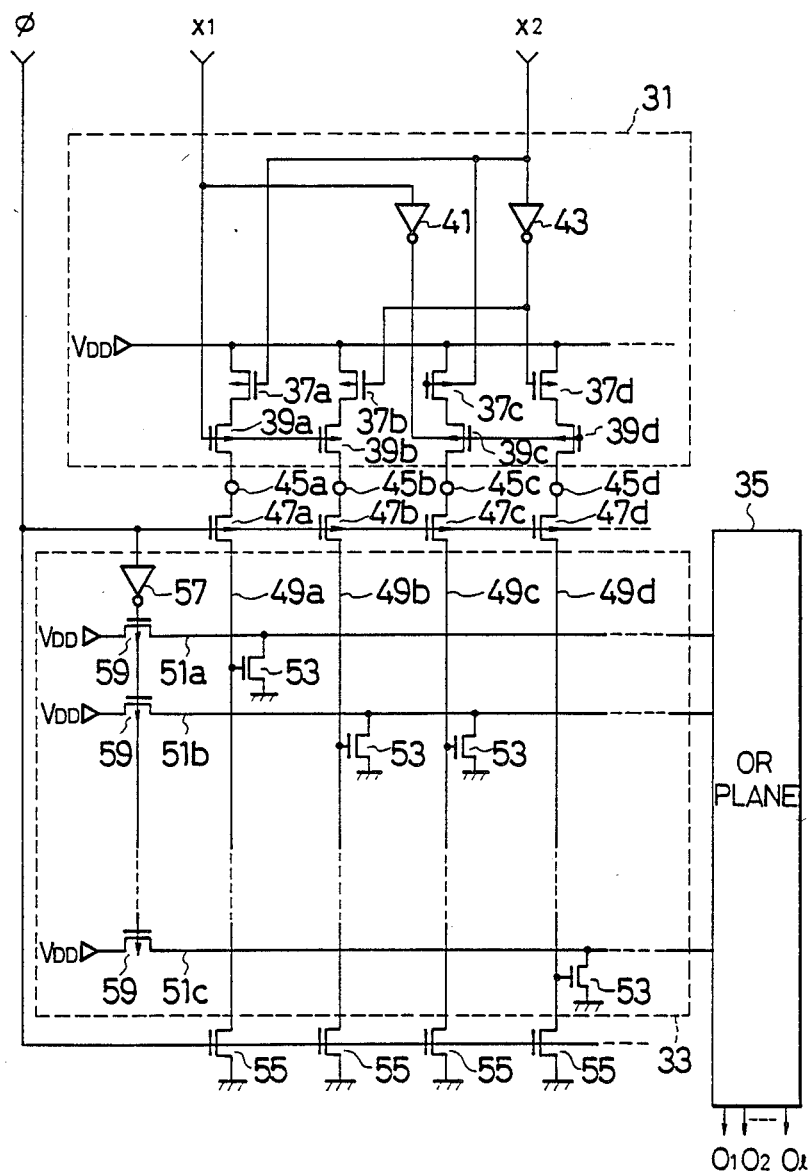
FIG. 6 is a view showing the construction of a programmable logic array in accordance with one embodiment of the present invention.

FIG. 6 is a view showing the construction of a programmable logic array (which is called PLA in the following description) provided with an input decoder in accordance with one embodiment of the present invention. In FIG. 6, the PLA is a programmable logic array of a synchronizing type, and comprises an input decoder 31 for performing the decoding operation per two bits with respect to input signals, an AND plane 33 for receiving decoded outputs of the decoder 31 and producing logic product terms of the respective decoded outputs, and an OR plane 35 for receiving the logic product terms obtained on the AND plane 33 and producing logic sums. FIG. 6 shows only a portion for treating the input signals of two bits, for example.

In FIG. 6, the input decoder 31 is constituted by FETs 37a, 37b, 37c, 37d, 39a, 39b, 39c and 39d of P-channel type, and inverters 41 and 43.

FET 37a and FET 39a are connected in series to each other and are inserted between a power source $V_{DD}$ and an output terminal 45a. An input signal $x_2$ is supplied to a gate terminal of FET 37a, and an input signal $x_1$ is supplied to a gate terminal of FET 39a.

FET 37b and FET 39b are connected in series to each other and are inserted between the power source $V_{DD}$ and an output terminal 45b. The inverter 43 inverts the input signal $x_2$, and the inverted input signal is supplied to a gate terminal of FET 37b, and the input signal $x_1$ is supplied to a gate terminal of FET 39b.

FET 37c and FET 39c are connected in series to each other and are inserted between the power source $V_{DD}$ and an output terminal 45c. The input signal $x_2$ is supplied to a gate terminal of FET 37c, and an inverted signal of the input signal $x_1$ inverted by the inverter 41 is supplied to a gate terminal of FET 39c.

FET 37d and FET 39d are connected in series to each other and are inserted between the power source $V_{DD}$ and an output terminal 45d. The inverted signal of the input signal $x_2$ inverted by the inverter 43 is supplied to a gate terminal of FET 37d, and the inverted signal of the input signal $x_1$ inverted by the inverter 41 is supplied to a gate terminal of FET 39d.

Figure 1:
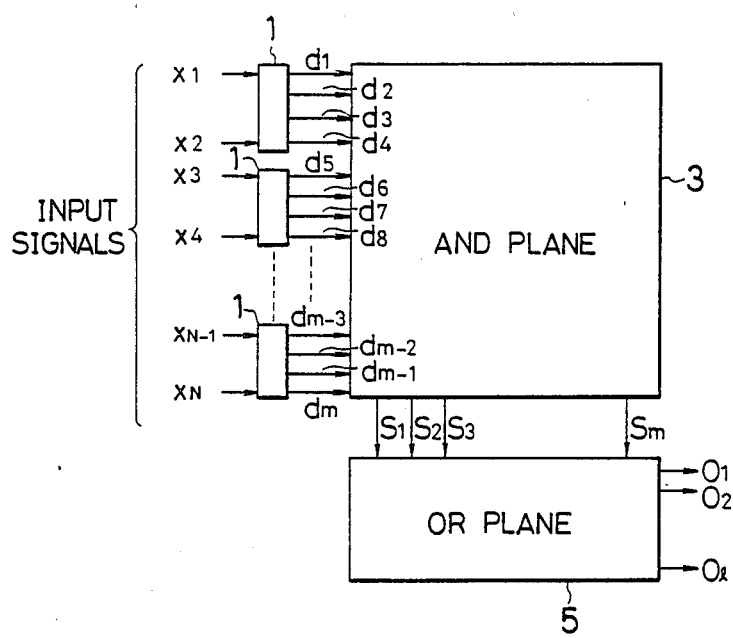
FIG. 1 is a view showing the construction of a conventional programmable logic array provided with an input decoder.
Figure 2:
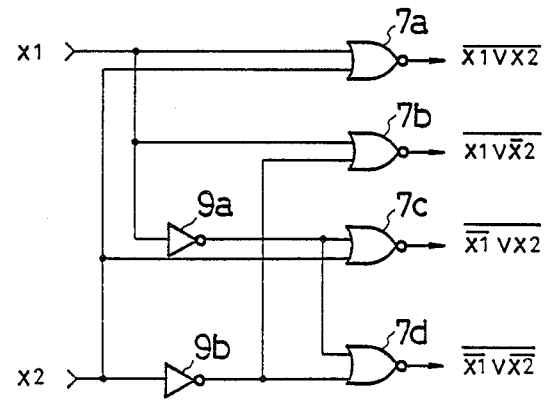
FIG. 2 is a view showing one detailed example of the input decoder of the PLA shown in FIG. 1.
Figure 3:
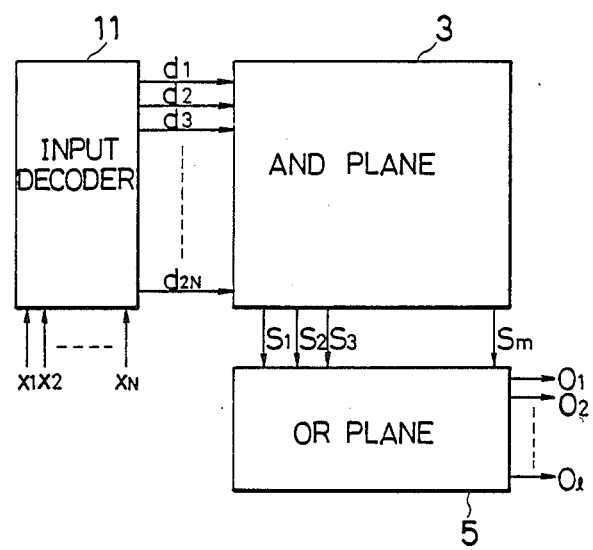
FIG. 3 is a view showing the construction of another conventional PLA provided with an input decoder.
Figure 4:
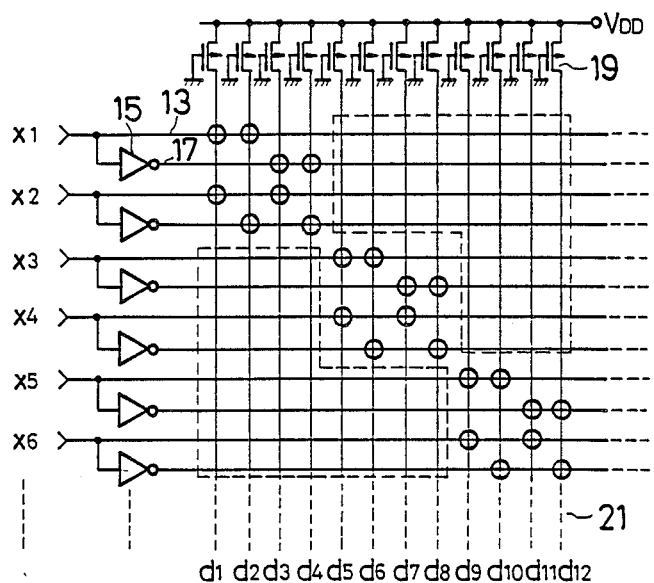
FIG. 4 is a view showing one detailed example of the input decoder of the PLA shown in FIG. 3.
Figure 5:
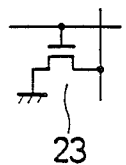
FIG. 5 is a view showing the construction of a FET in FIG. 4.

The input decoder 31 outputs the following logic decoded results to corresponding output terminals 45a to 45d with respect to the input signals $x_1$ and $x_2$ where the logic is similar to the one in the input decoder of FIGS. 2, 4 and 5.

| | |
|---|---|
| Output terminal 45a | $\overline{x_1 + x_2}$ |
| output terminal 45b | $\overline{x_1 + \overline{x_2}}$ |
| output terminal 45c | $\overline{\overline{x_1} + x_2}$ |
| output terminal 45d | $\overline{\overline{x_1} + \overline{x_2}}$ |

The respective output terminals 45a to 45d of the input decoder 31 are connected to corresponding input lines 49a to 49d of the AND plane 33 through corresponding FETs 47a to 47d of P-channel type. The gate terminals of the respective FETs 47a to 47d receive a control signal of clock signal $\phi$ for operating the PLA as a synchronizing type PLA. The operations of FETs 47a to 47d are controlled by the clock signal $\phi$, and FETs 47a to 47d supply the decoded results outputted to the respective output terminals 45a to 45d to the input lines 49a to 49d of the AND plane 33.

Figures 7, 8:
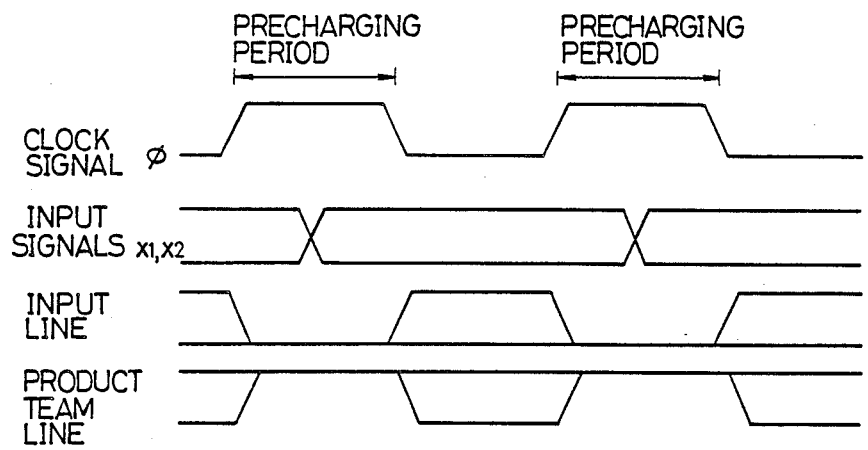
FIG. 7 is a view showing logic outputs with respect to input signals in an input decoder in the PLA shown in FIG. 6.
FIG. 8 is a timing chart of the PLA shown in FIG. 6.

As mentioned above, since the respective output terminals 45a to 45d are connected to the input lines 49a to 49d of the AND plane 33 through the corresponding FETs 47a to 47d, the input signals $x_1$ and $x_2$ and the respective output terminals 45a to 45d are at the levels as shown in FIG. 7 when the clock signal $\phi$ is in a high level state in voltage and FETs 47a to 47d are turned off. In FIG. 7, numeral H designates a high level state, and Z designates a high impedance state.

As shown in FIG. 6, the AND plane 33 has the input lines 49a to 49d, product term lines 51a, 51b and 51c disposed to be perpendicular to the input lines 49a to 49d, and FETs 53 of N-channel type disposed at predetermined intersections between the product term lines 51a to 51c and the input lines 49a to 49d, and inserted between the product term lines and ground, and having gate terminals connected to the input lines.

Terminals of the respective input lines 49a to 49d, which are not connected to the corresponding FETs 47a to 47d, are connected to ground through FETs 55 of N-channel type having gate terminals receiving the clock signal $\phi$.

Accordingly, as shown in FIG. 8, when the clock signal $\phi$ is in the high level state showing the precharging period of the product term lines, FETs 47a to 47d are turned off and FETs 55 are turned on so that all of the input lines 49a to 49d are discharged and go to the low level state. When the clock signal $\phi$ is in the low level state, FETs 47a to 47d are turned on and FETs 55 are turned off so that the decoded outputs supplied to the respective output terminals 45a to 45d of the input decoder 31 are respectively supplied to the corresponding input lines 49a to 49d.

One terminal of each of the respective product term lines 51a to 51c are connected to the power source $V_{DD}$ through FETs 59 of P-channel type having gate terminals receiving inverted signals provided by inverting the clock signal $\phi$ by the inverter 57. The other terminals of the product term lines 51a to 51c are connected to the OR plane 35.

Accordingly, when the clock signal $\phi$ is in the high level state and all of the input lines 49a to 49d are in the low level state, all of the FETs 53 are turned off so that all of the product term lines 51a to 51c are precharged and go to the high level state. When the clock signal $\phi$ is in the low level state, FETs 53 are turned on and off in accordance with the decoded outputs supplied to the respective input lines 49a to 49d, thereby supplying logic product terms with respect to the input signals $x_1$ and $x_2$ to the OR plane 35.

The operation of the programmable logic array in accordance with the above embodiment of the present invention will now be described with reference to the timing chart shown in FIG. 8.

In the PLA shown in FIG. 6, when the clock signal $\phi$ is in the high level state showing the precharging period, FETs 47a to 47d are turned off and FETs 55 are turned on so that all of the input lines 49a to 49d are in the low level state. Further, FETs 59 are turned on, and all of the product term lines 51a to 51c are precharged and becomes in the high level state.

In such a state showing the precharging period, when the input signals $x_1$ and $x_2$ are supplied to the input decoder 31, the decoded outputs shown in FIG. 7 are supplied to the respective output terminals 45a to 45d of the input decoder 31 with respect to the levels of the input signals $x_1$ and $x_2$. For example, when both the input signals $x_1$ and $x_2$ are in the "0" level state, both FETs 37a and 39a are turned on and the output terminal 45a goes to the high level state. On the one hand, when at least one of the input signals $x_1$ and $x_2$ is at the level "1", either one of FETs 37a and 39a is turned off and the output terminal 45a goes to the high impedance state.

In such a state, when the clock signal $\phi$ is changed from the high level state to the low level state, FETs 47a to 47d are turned on and all of FETs 55 are turned off. Thus, when both the input signals $x_1$ and $x_2$ are at the level "0", the input line 49a is in the high level state. When both the input signals $x_1$ and $x_2$ are not at the level "0", the input line 49a is held at a state after the precharging, namely, the low level state. Accordingly, while the clock signal $\phi$ is in the low level state, the decoded results shown by the logic table mentioned before are outputted to the input line 49a.

Similarly, the decoded results shown by the logic table mentioned before are outputted to the input lines 49b, 49c and 49d.

When the decoded results with respect to the input signals $x_1$ and $x_2$ are supplied to the respective input lines 49a to 49d, the logic levels of the respective product term lines 51a to 51c are determined in accordance with the respective decoded results, and are then supplied to the OR plane 35, thereby providing outputs of the OR plane 35 with respect to the logic levels of the input signals $x_1$ and $x_2$, i.e., outputs of the PLA.

As mentioned above, the input decoder 31 is constituted as in the PLA of FIG. 6 with respect to the input signals $x_1$ and $x_2$, so that the integrated degree can be improved in comparison with the PLA constituted by the logic gates shown in FIG. 2.

The sizes of FETs 37a to 37d and 39a to 39d constituting the input decoder 31, and the sizes of FETs 47a to 47d supplying the decoded results of the input decoder 31 to the AND plane 33 are not changed irrespective of the number of input signals, and the number of outputs of the input decoder 31 is two times the number of input signals. Accordingly, the area of the input decoder 31 is proportional to the number of input signals, and the increase of the area of the input decoder 31 can be restrained with respect to the increase of the number of input signals in comparison with the input decoder having the matrix structure shown in FIG. 4.

Further, the inverters 41 and 43 for inverting the input signals in the input decoder 31 do not directly operate the signals supplied to the input lines 49a to 49d of the AND plane 33, but control the operation of two FETs of the input decoder 31 so that the inverters 41 and 43 can be made compact and the integrated degree of the input decoder 31 can be improved in comparison with the input decoder of FIG. 4.

Further, the input decoder 31 and the AND plane 33 are operated in synchronization with the clock signal $\phi$ so that the operation can be performed at high speed and no stationary electric current flows through them and the PLA can be operated by less consumed electric power.

As mentioned above, in accordance with the present invention, the operations of a plurality of paired transistors constituting an input decoder and connected in series to each other are controlled by input signals and their inverted input signals to obtain a predetermined logic with respect to the input signals and the inverted input signals, thereby attaining high integration of the programmable logic array provided with the input decoder.

What is claimed is:

1. A programmable logic array comprising:
   input decoding means having a plurality of first transistor means each comprising a pair of transistors connected in series to each other and each first transistor means receiving a different combination of true and complementary input signals, said input decoding means providing logic output signals through respective ones of said first transistor means as a function of said true and complementary input signals applied to said pair of transistors;
   second transistor means coupled for precharging the input lines of an AND array in accordance with the logic output signals of said input decoding means and a received clock signal; and
   third transistor means coupled for predischarging the input lines in accordance with the clock signal.

2. The programmable logic array as claimed in claim 1, wherein said input decoding means comprises inverters receiving the input signals and inverting same to provide the complementary input signals.

3. A programmable logic array comprising:
   input decoding means having a plurality of first transistor means each comprising a pair of transistors connected in series to each other and each first transistor means receiving a different combination of true and complementary input signals, said input decoding means providing logic output signals through respective ones of said first transistor means as a function of said true and complementary input signals applied to said pair of transistors;
   second transistor means coupled for charging up the input lines of an AND array in accordance with the logic output signal of said input decoding means and a received timing control signal; and
   third transistor means coupled for predischarging the input lines in accordance with the timing control signal.

4. A logic circuit comprising:
   first and second reference terminals providing first and second reference voltage levels;
   a decoder composed of a plurality of two bit decoding circuits, each decoding circuit comprising two input terminals for receiving digital input signals and four output terminals, two inverters for providing complementary signals of the digital input signals inputted to said input terminals and four pairs of transistors, each pair having a first and second transistor connected in series to each other between said four output terminals and said first reference voltage level and receiving as the gate signals a different combination of true and complementary digital input signals;

a plurality of decoded input lines coupled to the output terminals of said plurality of two bit decoding circuits;

a plurality of product term lines each coupled with said first reference voltage level at one end thereof, a plurality of transistors selectively provided to form an AND array, each transistor of said AND array being connected between one of said product term lines and said second reference voltage level with its gate terminal connected to one of said decoded input lines;

a first switching means for making or breaking the connections between the output terminals of said plurality of two bit decoding circuit and said decoded input lines in accordance with a timing pulse signal;

a second switching means for making or breaking the connection between the second reference voltage level and the other ends of said decoded input line in accordance with said timing pulse signal; and a third switching means for making or breaking the connection between the first reference voltage level and the one ends of said product term lines in accordance with the inverted signal of said timing pulse signal.

5. The circuit of claim 4 wherein said first, second and third switching means comprise transistors receiving the timing pulse signal at gate terminals thereof.

6. The circuit of claim 4 wherein said timing pulse signal is a clock signal available in a digital system in which said logic circuit is used.

7. The circuit of claim 4 wherein said first and second reference voltage levels are high and low levels representing the two states of the binary system.

* * * * *